United States Patent
Fukuhara et al.

(10) Patent No.: US 7,740,994 B2
(45) Date of Patent: Jun. 22, 2010

(54) METHOD FOR SELECTING PHOTOMASK SUBSTRATE, METHOD FOR MANUFACTURING PHOTOMASK, AND METHOD FOR MANUFACTURING SEMICONDUCTOR DEVICE

(75) Inventors: Kazuya Fukuhara, Tokyo (JP); Masamitsu Itoh, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 660 days.

(21) Appl. No.: 11/585,130

(22) Filed: Oct. 24, 2006

(65) Prior Publication Data

US 2007/0092811 A1    Apr. 26, 2007

(30) Foreign Application Priority Data

Oct. 25, 2005   (JP)   ............... 2005-309883

(51) Int. Cl.
G03F 1/00   (2006.01)
(52) U.S. Cl. ............... 430/5; 430/311; 382/144
(58) Field of Classification Search ............... 382/144; 430/5, 30, 311; 356/237.2
See application file for complete search history.

(56) References Cited

U.S. PATENT DOCUMENTS

| | | | |
|---|---|---|---|
| 6,413,682 B1 | 7/2002 | Shibano et al. | |
| 6,483,937 B1 * | 11/2002 | Samuels | ............... 382/144 |
| 6,758,063 B2 | 7/2004 | Priestley et al. | |
| 6,783,898 B2 | 8/2004 | Berkey et al. | |
| 2002/0187407 A1 * | 12/2002 | Priestley et al. | ............... 430/5 |
| 2004/0010385 A1 | 1/2004 | Fukuhara et al. | |

FOREIGN PATENT DOCUMENTS

| JP | 2000-330263 | 11/2000 |
|---|---|---|
| JP | 3246615 | 11/2001 |

* cited by examiner

*Primary Examiner*—Mark F Huff
*Assistant Examiner*—Stewart A Fraser
(74) *Attorney, Agent, or Firm*—Finnegan, Henderson, Farabow, Garrett & Dunner, L.L.P.

(57) ABSTRACT

According to an aspect of the invention, there is provided a method for selecting a photomask substrate, including dividing a chip area scheduled to be arranged on the photomask substrate regarding a specific transfer pattern layer into a management pattern area in which an element pattern changed in shape by birefringence of the photomask substrate is arranged, and an area other than the management pattern area, setting a standard value of a size of birefringence of an area in which the management pattern area of the photomask substrate is arranged, inspecting the size of the birefringence of each of a plurality of photomask substrate candidates, and selecting a photomask substrate, in which the size of the birefringence satisfies the standard value, as a photomask substrate of the specific transfer pattern layer from the plurality of photomask substrate candidates.

15 Claims, 11 Drawing Sheets

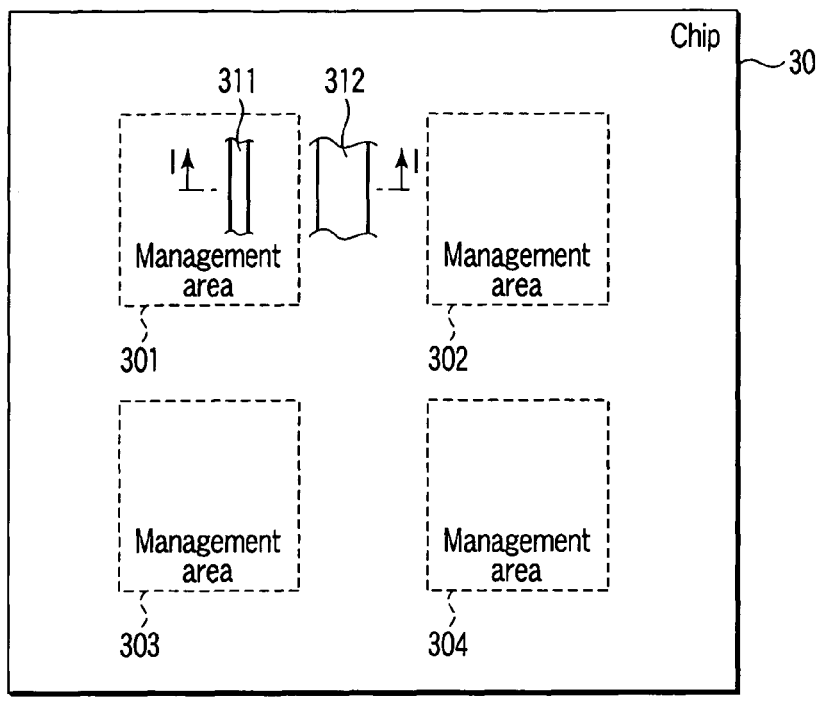
F I G. 7
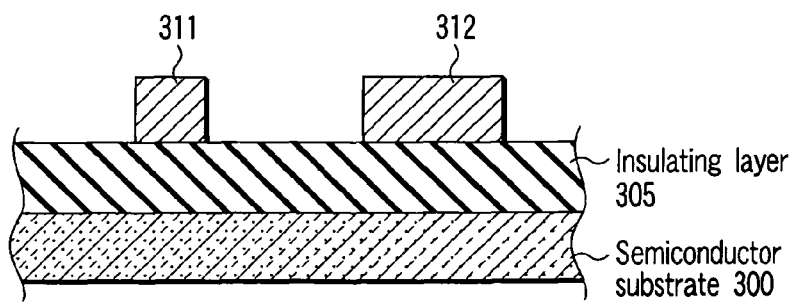
F I G. 8
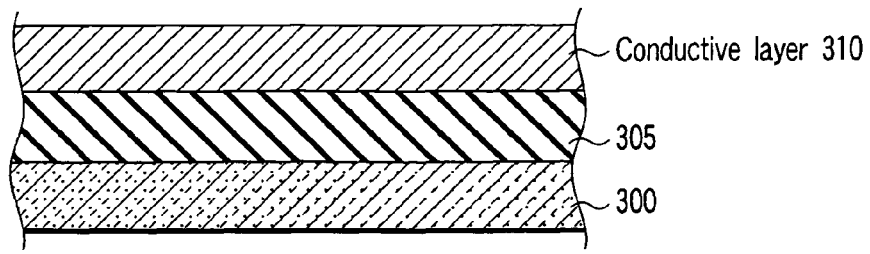
F I G. 9

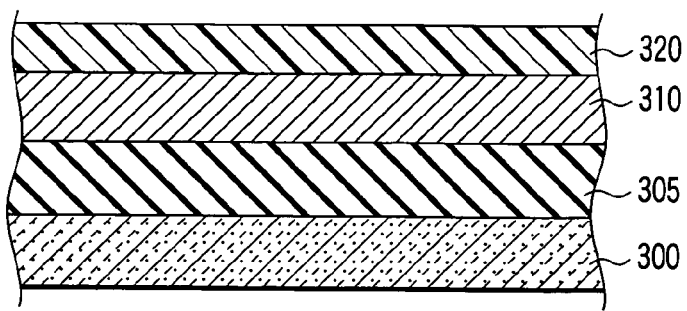
F I G. 10
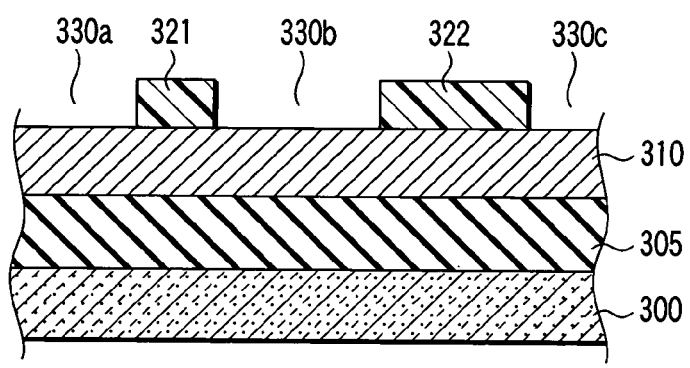
F I G. 11
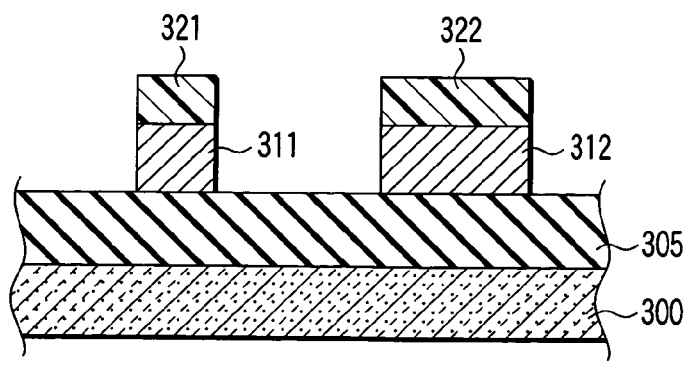
F I G. 12

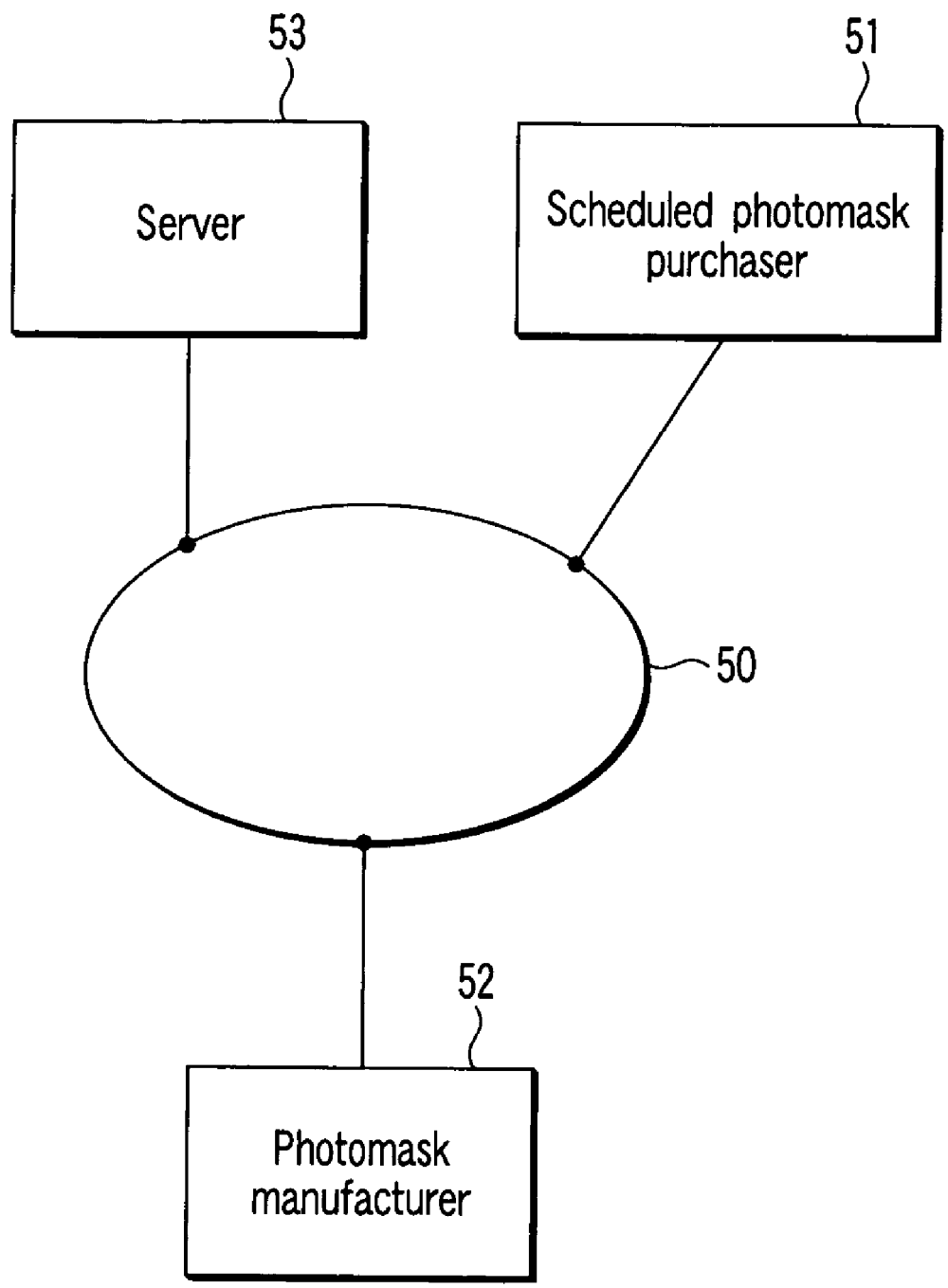
F I G. 16

METHOD FOR SELECTING PHOTOMASK SUBSTRATE, METHOD FOR MANUFACTURING PHOTOMASK, AND METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2005-309883, filed Oct. 25, 2005, the entire contents of which are incorporated herein by reference.

BACKGROUND OF THE INVENTION

1. Field of the Invention

The present invention relates to a method for selecting a photomask substrate, and more particularly, it relates to a method for selecting a photomask substrate for use in a photolithography process which uses a polarized light as an illumination light, a method for manufacturing a photomask, and a method for manufacturing a semiconductor device.

2. Description of the Related Art

In recent years, a polarized light has been used as an illumination light in a photolithography process to form a very small element pattern on a semiconductor substrate (e.g., Japanese Patent No. 3246615). The "polarized light" is a light in which a vibration direction of an electric vector is aligned in a specific direction. When an illumination light is brought into a polarized light of a proper state in the photolithography process, the element pattern on a photomask is transferred to the semiconductor substrate with desired accuracy, whereby an element pattern of a shape smaller than a wavelength of the illumination light can be formed on the semiconductor substrate. The "state of polarized light" is a direction of a polarized direction, i.e., a vibration light of an electric vector.

However, when the polarized light passes through a birefringence material having birefringence, a polarizing direction of the polarized light rotates to change the state of the polarized light. The "birefringence" is a phenomenon in which the polarized light passing through the birefringence material is divided into a plurality of polarized lights of different speeds dependent on the vibration direction of the electric vector. A speed difference generated in the polarized lights advancing through the birefringence material is observed as a phase difference between the polarized lights which have passed through the birefringence material. Generally, a polarize state of the polarized light passing through the birefringence material fluctuates.

Thus, if the photomask is made of a birefringence material, when a polarized state of an illumination light passing through the photomask fluctuates, contrast of an image projected on the semiconductor substrate also fluctuates. In other words, in the photolithography process in which the photomask is made of a birefringence material and the polarized light is used as the illumination light, depending on a fluctuation amount of the polarized state of the illumination light, a shape of a photoresist film formed on the semiconductor substrate deviates from a desired shape. Hereinafter, deviation from the desired shape will be referred to as "shape fluctuation". The shape fluctuation is a two-dimensional fluctuation with respect to a desired pattern width of the photoresist film, not including a thickness fluctuation.

A size of the fluctuation amount of the polarized state of the illumination light depends on a size of birefringence of the photomask through which the illumination light passes. The "size of the birefringence" is a speed difference generated when the polarized lights pass through the birefringence material, and observed as a phase difference between the polarized lights. For example, the size of the birefringence is represented as a phase difference between two polarized lights which pass through the birefringence material by 1 cm. Generally, the phase difference is represented by a wavelength of the polarized light. For example, in the case of an argon fluoride (ArF) excimer laser beam whose center wavelength is 193 nm, a phase difference of one wavelength is 193 nm. Accordingly, [nm/cm] is used for a size unit of the birefringence.

The size of the fluctuation amount of the polarized state of the illumination light depends on the size of the birefringence of the photomask. Accordingly, in-plane variance of the size of the birefringence of the photomask causes in-plane variance of a fluctuation amount of the shape of the photoresist film formed on the semiconductor substrate. In other words, the in-plane variance of the size of the birefringence of the photomask causes size variance of the element pattern transferred to the semiconductor substrate. Consequently, when there is the birefringence in the photomask, an image of a desired shape may not be transferred to the semiconductor substrate.

Generally, a fluctuation amount (hereinafter referred to as "polarization error sensitivity") of the shape of the element pattern transferred to the semiconductor substrate with respect to a fluctuation amount of the polarized state of the illumination light is larger as an element pattern to be transferred is smaller. Accordingly, to form a very small element pattern on the semiconductor substrate, a photomask of small birefringence must be applied to the photolithography process. For example, a size of birefringence is set to 1 nm or less per photomask thickness.

A size of birefringence of the photomask is known to reflect a distribution of heat applied to a photomask substrate during its manufacturing process. Thus, for example, by executing annealing, improving a cooling method of the photomask substrate, adjusting a composition of the photomask substrate or the like in the manufacturing process of the photomask substrate, in-plane variance of a size of birefringence of the photomask substrate is reduced (e.g., Jpn. Pat. Appln. KOKAI Publication No. 2000-330263). A mask substrate of small in-plane variance of a size of birefringence is selected from a plurality of manufactured photomask substrates, and an element pattern is formed on the selected photomask substrate to manufacture a photomask.

However, the manufacturing of the photomask substrate small in-plane variance of a size of birefringence needs a high level technology, and it is difficult to increase yield of photomask substrates small in-plane variance of a size of birefringence. In consequence, photomask substrate manufacturing costs are increased, causing an increase in photomask manufacturing costs. In short, there is a problem of an increase in semiconductor device manufacturing costs.

BRIEF SUMMARY OF THE INVENTION

According to an aspect of the invention, there is provided a method for selecting a photomask substrate, comprising: dividing a chip area scheduled to be arranged on the photomask substrate regarding a specific transfer pattern layer into a management pattern area in which an element pattern changed in shape by birefringence of the photomask substrate is arranged, and an area other than the management pattern area; setting a standard value of a size of birefringence of an area in which the management pattern area of the photomask substrate is arranged; inspecting the size of the birefringence of each of a plurality of photomask substrate candidates; and selecting a photomask substrate, in which the size of the birefringence satisfies the standard value, as a photomask substrate of the specific transfer pattern layer from the plurality of photomask substrate candidates.

According to another aspect of the invention, there is provided a method for manufacturing a photomask, comprising: dividing a chip area scheduled to be arranged on a photomask substrate regarding a specific transfer pattern layer into a management pattern area in which an element pattern changed in shape by birefringence of the photomask substrate is arranged, and an area other than the management pattern area; setting a standard value of a size of birefringence of an area in which the management pattern area of the photomask substrate is arranged; inspecting the size of the birefringence of each of a plurality of photomask substrate candidates; selecting a photomask substrate, in which the size of the birefringence satisfies the standard value, as a photomask substrate of the specific transfer pattern layer from the plurality of photomask substrate candidates; and forming the plurality of element patterns included in the chip area on the selected photomask substrate to manufacture the photomask of the specific transfer pattern layer.

According to another aspect of the invention, there is provided a method for manufacturing a semiconductor device, comprising: dividing a chip area scheduled to be arranged on a photomask substrate regarding a specific transfer pattern layer into a management pattern area in which an element pattern changed in shape by birefringence of the photomask substrate is arranged, and an area other than the pattern area; setting a standard value of a size of birefringence of an area in which the management pattern area of the photomask substrate is arranged; inspecting the size of the birefringence of each of a plurality of photomask substrate candidates; selecting a photomask substrate, in which the size of the birefringence satisfies the standard value, as a photomask substrate of the specific transfer pattern layer from the plurality of photomask substrate candidates; repeating the selection of the photomask substrate of the specific transfer pattern layer for the plurality of transfer pattern layers to form the plurality of element patterns included in the chip area for each corresponding transfer pattern layer on the plurality of photomask substrates selected for each transfer pattern, thereby manufacturing a plurality of photomasks; and combining a photolithography process using the plurality of photomasks with another process to process at least one of a surface of the semiconductor substrate and a thin film formed on the surface of the semiconductor substrate.

BRIEF DESCRIPTION OF THE SEVERAL VIEWS OF THE DRAWING

FIG. 7 is a top view of a semiconductor device manufactured by the method for manufacturing a semiconductor device according to the embodiment of the invention.

FIG. 8 is a sectional view of the semiconductor device shown in FIG. 7.

FIG. 9 is a process sectional view for explaining the method for manufacturing a semiconductor device according to the embodiment of the invention. (the first)

FIG. 10 is a process sectional view for explaining the method for manufacturing a semiconductor device according to the embodiment of the invention. (the second)

FIG. 11 is a process sectional view for explaining the method for manufacturing a semiconductor device according to the embodiment of the invention. (the third)

FIG. 12 is a process sectional view for explaining the method for manufacturing a semiconductor device according to the embodiment of the invention. (the fourth)

FIG. 16 is a schematic view showing an example of a network system used in the method for manufacturing a photomask shown in FIG. 15.

DETAILED DESCRIPTION OF THE INVENTION

Figure 1:
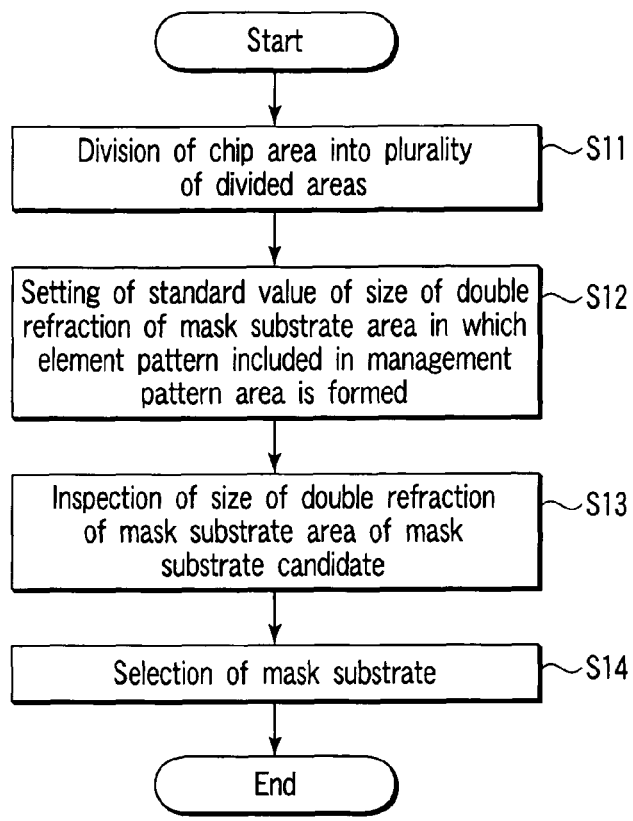
FIG. 1 is a flowchart for explaining a method for selecting a mask substrate according to an embodiment of the invention.

The embodiments of the present invention will be described below with reference to the accompanying drawing. In the drawings, identical or similar sections are denoted by identical or similar reference numerals. It should be noted, however, that the drawings are schematic, and a relation between thickness and a planar size, a thickness ratio of each layer, and the like are different from those of a real case. Thus, specific thickness and sizes should be determined based on the following description. Needless to say, among the drawings, sections of different size relations or ratios are included.

The embodiments described below exemplify devices or methods for embodying technical ideas of the present invention, and the technical ideas of the invention do not limit qualities, shapes, structures, or arrangements of components to those described below. Various changes can be made of the technical ideas of the invention within a scope of claims.

As shown in FIG. 1, a method for selecting a photomask substrate (hereinafter referred to as "mask substrate") of an embodiment of the present invention includes a step of dividing a chip area scheduled to be arranged on the photomask substrate regarding a specific transfer pattern layer into a management pattern area in which an element pattern changed in shape by birefringence of the photomask substrate and an area other than the pattern area, a step of setting a standard value of a size of birefringence of an area in which the management pattern area of the photomask substrate is arranged, a step of inspecting a size of birefringence of each of a plurality of photomask substrate candidates, and a step of selecting a photomask substrate, in which the size of the birefringence satisfies the standard value, as a photomask substrate for the specific transfer pattern layer among the plurality of photomask substrate candidates.

The "management pattern area" is set to include an element pattern in which a shape of a photoresist film formed on a semiconductor substrate deviates from a desired shape due to fluctuation of a polarized state of an illumination light used for a photolithography process. In other words, the standard value of a size of birefringence (hereinafter simply referred to as "standard value") is defined for a mask substrate area in which an area including an element pattern necessitating highly accurate size management is formed when each element pattern included in the chip area is formed on the mask substrate.

As a method for setting the management pattern area, for example, the following method can be employed. That is, a chip area including a plurality of adjacent wiring groups and a wiring pattern whose half pitch is equal to or less than 1/3 of a wavelength of an illumination light of an exposure apparatus is set as a management pattern area. For example, when an exposure apparatus using an ArF excimer laser beam whose center wavelength is 193 nm as an exposure light source is used for the photolithography process, a chip area including a line-and-space wiring group whose half pitch is 65 nm is set as a management pattern area.

Figure 2:
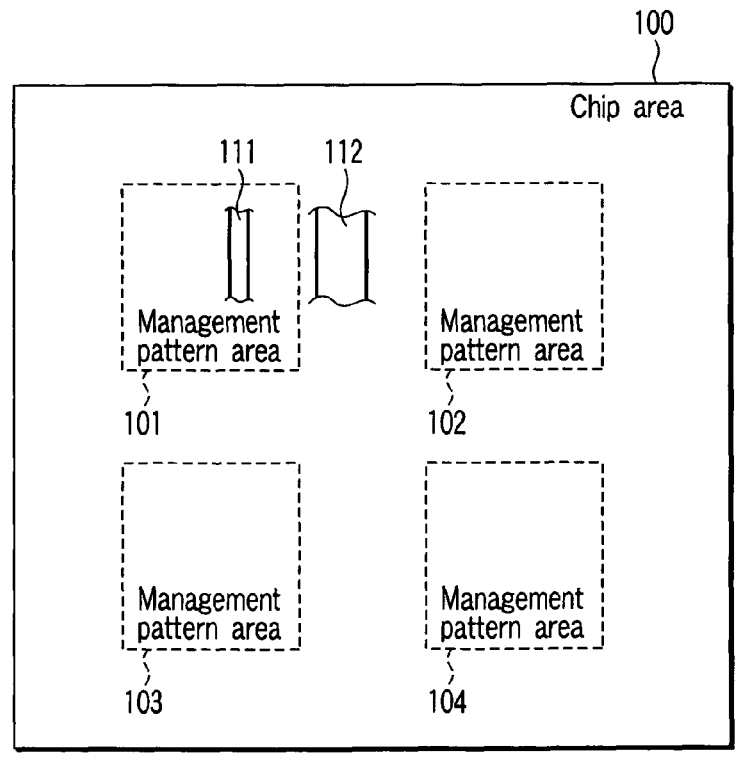
FIG. 2 is a top view of a chip area according to the embodiment of the invention.

FIG. 2 shows an example in which a chip area 100 scheduled to be arranged on the mask substrate is divided into a plurality of divided areas including management pattern areas 101 to 104. FIG. 2 shows the example in which the chip area 100 is divided into the management pattern areas 101 to 104 and divided areas other than the management pattern areas 101 to 104. It is presumed that standard values set in mask substrate areas in which the management pattern areas 101 to 104 are arranged are equal.

An element pattern 111 included in the management pattern area 101 shown in FIG. 2 is an element pattern which needs highly accurate size management. An element pattern 112 not included in any of the management pattern areas 101 to 104 but arranged between the management pattern area 101 and the management pattern area 102 is an element pattern larger in shape than the element pattern 111 but not in need of any highly accurate size management. For example, the element pattern 111 is a part of a wiring group narrower in wiring width and pitch than that including the element pattern 112.

A method for setting a standard value will be described before description of the method for selecting a mask substrate according to the embodiment of the present invention.

First, by optical simulation which takes a polarized state of an illumination light of the exposure apparatus into consideration, a relation is obtained between a size of a mask substrate (hereinafter referred to as "mask birefringence") and a size of shape fluctuation of a pattern width (hereinafter referred to as "shape fluctuation amount") of a photoresist film formed on the semiconductor substrate by transfer of a pattern of a photomask manufactured by forming an element pattern on the mask substrate. The "optical simulation" means calculation to estimate a light intensity distribution generated in a semiconductor substrate surface when an illumination light passed through the photomask reaches the semiconductor substrate. Additionally, based on the calculated light intensity distribution, a shape fluctuation amount of a photoresist film to be formed on the semiconductor substrate is virtually calculated with respect to a shape of the element pattern formed on the photomask, an exposure amount error and a semiconductor substrate focus error by the optical simulation.

Figure 3:
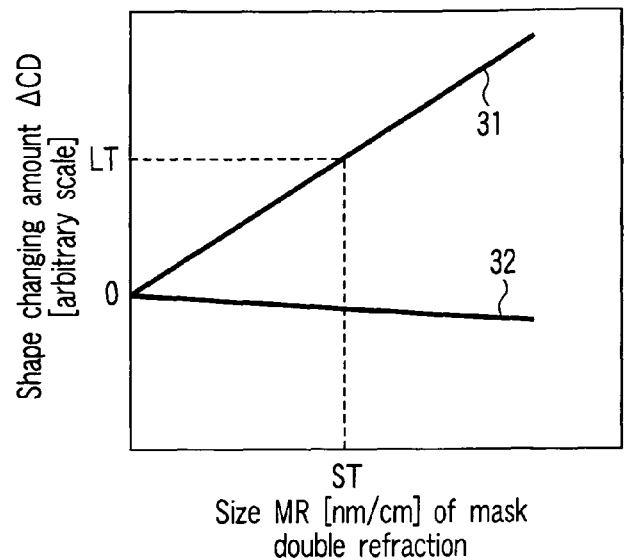
FIG. 3 is a graph showing an example of a relation between a size of mask birefringence and a shape fluctuation amount of a photoresist film.

FIG. 3 is a graph showing an example of a relation between a size MR of mask birefringence and a shape fluctuation amount ΔCD of a photoresist film calculated by the optical simulation. In FIG. 3, an axis (phase advance axis) of mask birefringence is directed so that an influence of the size MR of the mask birefringence on the shape fluctuation amount ΔCD can be maximum.

A straight line 31 shown in FIG. 3 indicates a shape fluctuation amount ΔCD of a photoresist film to form the element pattern 111 of FIG. 2 on the semiconductor substrate. In other words, the straight line 31 represents a size of an influence of the size MR of the mask birefringence on the element pattern 111. A straight line 32 indicates a shape fluctuation amount ΔCD of a photoresist film to form the element pattern 112 on the semiconductor substrate. As shown in FIG. 3, an influence of the size MR of the mask birefringence on the shape fluctuation amount ΔCD of the element pattern 112 is smaller as compared with that on the element pattern 111. In other words, polarization degree error sensitivity of the element pattern 112 is smaller as compared with the element pattern 111.

A standard value of the mask substrate area is set by using a result of the optical simulation. For example, by using the graph of FIG. 3, based on a permissible limit LT of the shape fluctuation amount ΔCD of the photoresist film to form the element pattern 11, a standard value ST of the mask substrate area in which the management pattern areas 101 to 104 are formed is set.

The method for selecting the mask substrate shown in FIG. 1 will be described below. An example of selecting a mask substrate in which the chip area 100 of FIG. 2 can be formed will be described.

(1) In a step S11, the chip area 100 is divided into a plurality of divided areas including the management pattern areas 101 to 104 as shown in FIG. 2 based on a shape of an element pattern included in the chip area 100.

(2) In a step S12, a standard value of a mask substrate area in which the management pattern areas 101 to 104 are formed is set. Specifically, based on the relation between the size MR of the mask birefringence and the shape fluctuation amount ΔCD of the photoresist film obtained by the optical simulation or the like, a standard value ST in the mask substrate area in which the management pattern areas 101 to 104 are formed is set.

(3) In a step S13, for a plurality of mask substrate candidates, a size MR of birefringence of the mask substrate area in which the management pattern areas 101 to 104 are formed is inspected. Specifically, a size MR of birefringence of the mask substrate area in which the management patterns 101 to 104 are formed is measured for each mask substrate candidate to determine whether it is equal to or less than the standard value ST. A method for measuring a size MR of birefringence will be described below.

(4) In a step S14, a mask substrate in which a size MR of birefringence of the mask substrate area having the management pattern areas 101 to 104 formed therein satisfies the standard value ST set for each mask substrate area is selected among a plurality of mask substrate candidates. By using the selected mask substrate, a photomask used for forming the element patterns 111 and 112 is manufactured.

For example, the size MR of birefringence is measured by applying an irradiation light of a limited beam diameter to the mask substrate, and investigating a polarized state of the irradiation light passed through the mask substrate. As a specific method for measuring the size MR of birefringence, it is possible to employ a rotation analyzer method for rotating an analyzer to detect a polarized state of a transmitted light, a phase modulation method for detecting a polarized state of an emitted light while rotating a polarizing direction of an incident light around an optical axis, or the like.

In the case of inspecting the mask substrate candidate in the step S13, for example, inspection accuracy can be adjusted as follows. Generally, the size MR of birefringence of the mask substrate has variance in a plane of the mask substrate. Accordingly, inspection accuracy is increased as the number of places for measuring a size MR of birefringence per unit area is larger, and birefringences of the mask substrate candidates are all managed so that quality of the mask substrates can be guaranteed. However, measurement time is lengthened as the number of measuring places is increased, causing a reduction in inspection efficient of the mask substrate candidate. Thus, measurement accuracy of a size of birefringence of the mask substrate area may be set for each divided area based on the shape of the element pattern included in the divided area. For example, the number of measuring places of a size MR of birefringence of the mask substrate area in which the management pattern areas 101 to 104 are formed is set larger than that of measuring places of the mask substrate area in which divided areas other than the management pattern areas 101 to 104 are formed. As a result, a reduction in mask substrate inspection efficiency is suppressed. For example, the number of measuring places is set to one per square millimeter in the mask substrate area in which the management pattern areas 101 to 104 are formed, and to one per square centimeter in the mask substrate area in which the divided areas other than the management pattern areas 101 to 104 are formed.

In the case of measuring a size MR of birefringence in a plurality of places of the mask substrate area in which the management patterns 101 to 104 are formed, for example, determination is made to as whether a maximum value of a size MR of birefringence in one and the same management pattern area, or an average value of sizes MR of birefringence in one and the same management pattern area is equal to or less than the standard value ST.

The example in which the standard values of the mask substrate areas having the management pattern areas 101 to 104 formed therein are equal has been described. However, according to a micronization level or the like of the element pattern included in the management pattern areas 101 to 104, different standard values may be set in the mask substrate areas in which the management patterns 101 to 104 are formed. When the standard values of the mask substrate areas in which the management pattern areas 101 to 104 are formed are set different, the standard values of the mask substrate areas are set based on a permissible limit required of the shape fluctuation amount of the photoresist film to form the element patterns included in the management pattern areas 101 to 104. Then, a photomask is manufactured by using a mask substrate which satisfies all the standard values of the mask substrate areas in which the management pattern areas 101 to 104 are formed. However, no standard value is set for a mask substrate area in which a micronization level of the element pattern is low and an element pattern included in the management pattern area not needing any standard value is formed.

Figure 4:
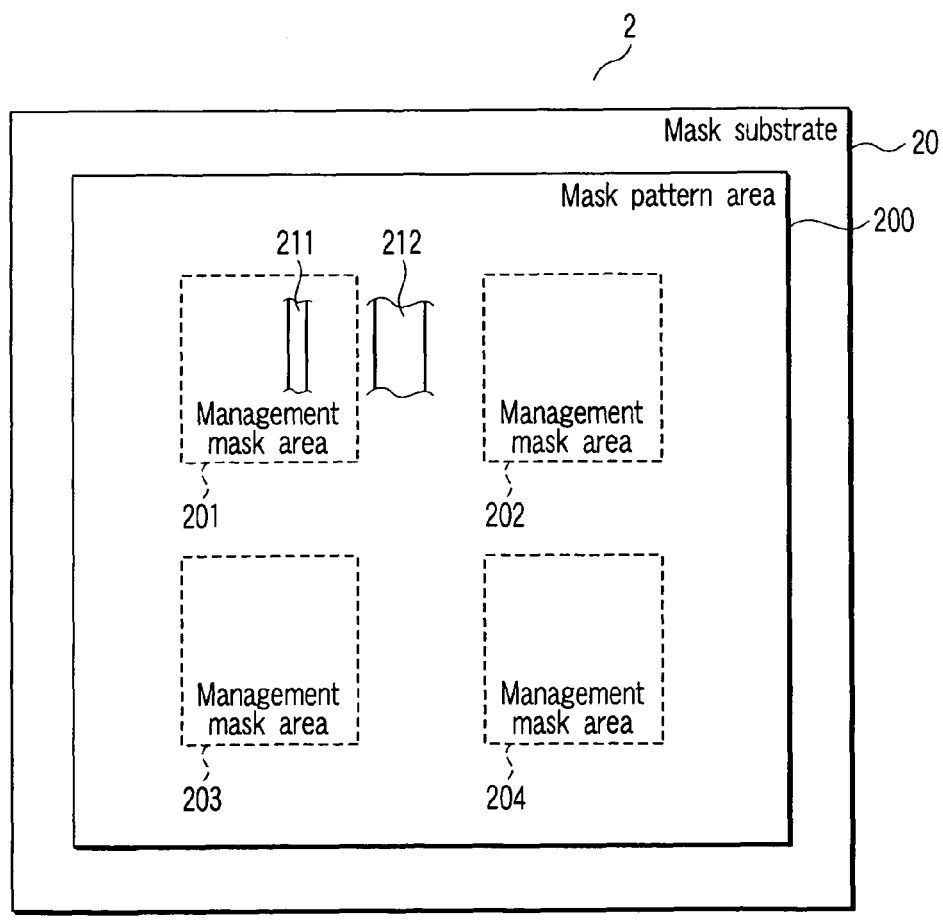
FIG. 4 is a top view of a photomask manufactured by a method for manufacturing a photomask according to the embodiment of the invention.

On the mask substrate selected by the method described above with reference to the flowchart of FIG. 1, the element pattern is formed to manufacture a photomask. FIG. 4 shows an example in which the chip area 100 of FIG. 2 is formed on a selected mask substrate 20 to manufacturer a photomask 2. That is, the management pattern areas 101 to 104 shown in FIG. 2 are formed in management mask areas 201 to 204 shown in FIG. 4. As shown in FIG. 4, a mask pattern 211 formed based on the element pattern 111 is arranged in the management mask area 201. A mask pattern 212 formed based on the element pattern 112 is arranged between the management mask areas 201 and 202.

As described above, the mask substrate 20 is selected so that sizes of birefringences of the management mask areas 201 to 204 can be equal to or less than the standard value ST. Accordingly, in the photolithography process using the photomask 2 shown in FIG. 4, a shape fluctuation amount ΔCD of a photoresist film formed on the semiconductor substrate is equal to or less than the permissible limit LT. A mask pattern area 200 of FIG. 4 includes a light transmitting section, a light shielding section, a phase shifting section, and the like (not shown). The photomask 2 includes an aligning mark or the like (not shown).

Figure 5:
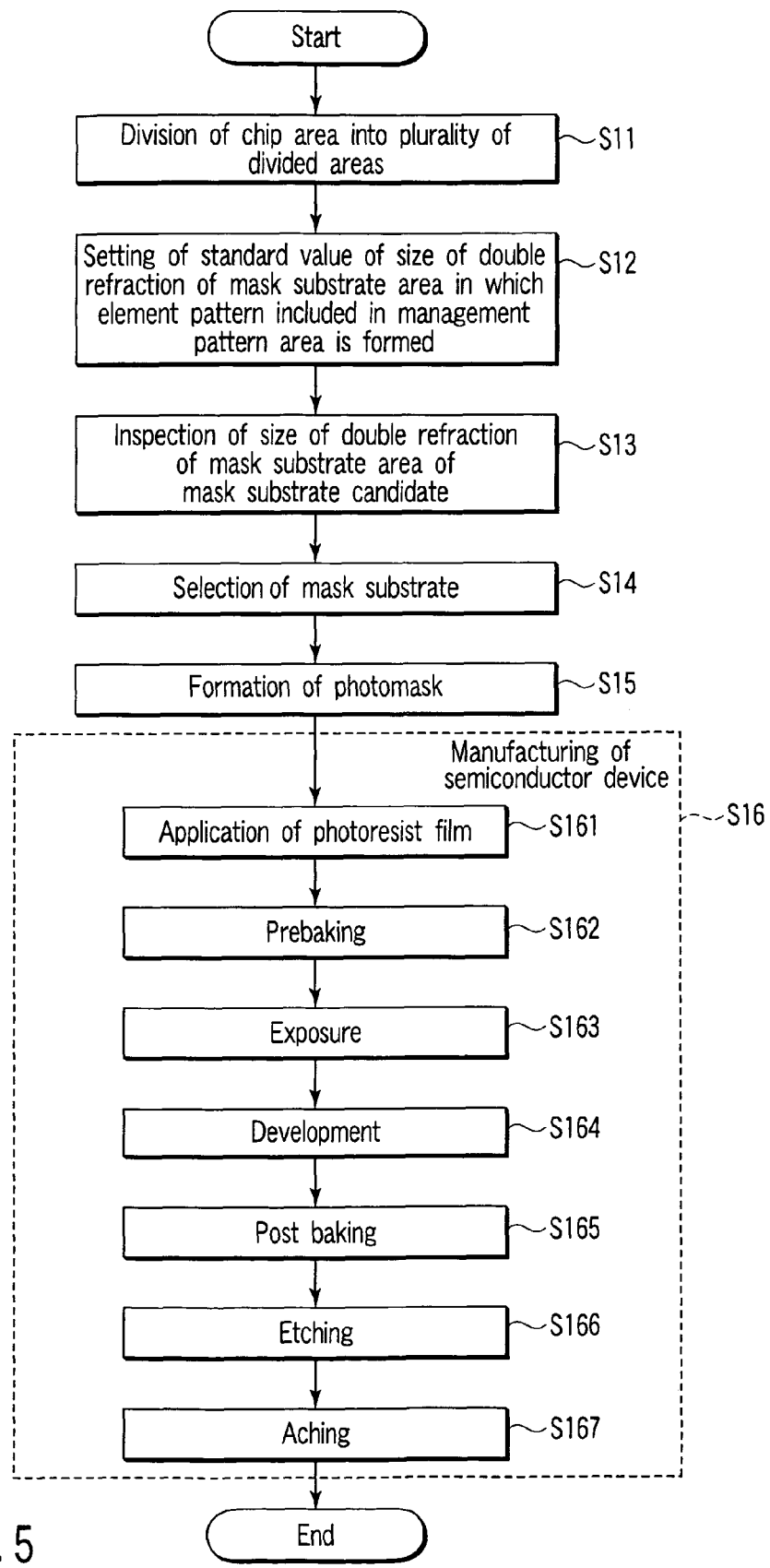
FIG. 5 is a flowchart for explaining a method for manufacturing a semiconductor device according to the embodiment of the invention.

FIG. 5 shows an example of a method for manufacturing a semiconductor device by using the photomask 2 of FIG. 4. A flowchart of FIG. 5 shows a photolithography process and an etching process of a resist mask formed by the photolithography process only of the method for manufacturing the semiconductor device, which are parts only of various processes including processes shown in FIGS. 9 to 12 which will hereinafter be described. In other words, in actual manufacturing of a semiconductor device, needless to say, there are many processes not shown in FIG. 5, and selective ion implantation may be executed by using the resist mask of the photolithography process for ion implantation.

Figure 6:
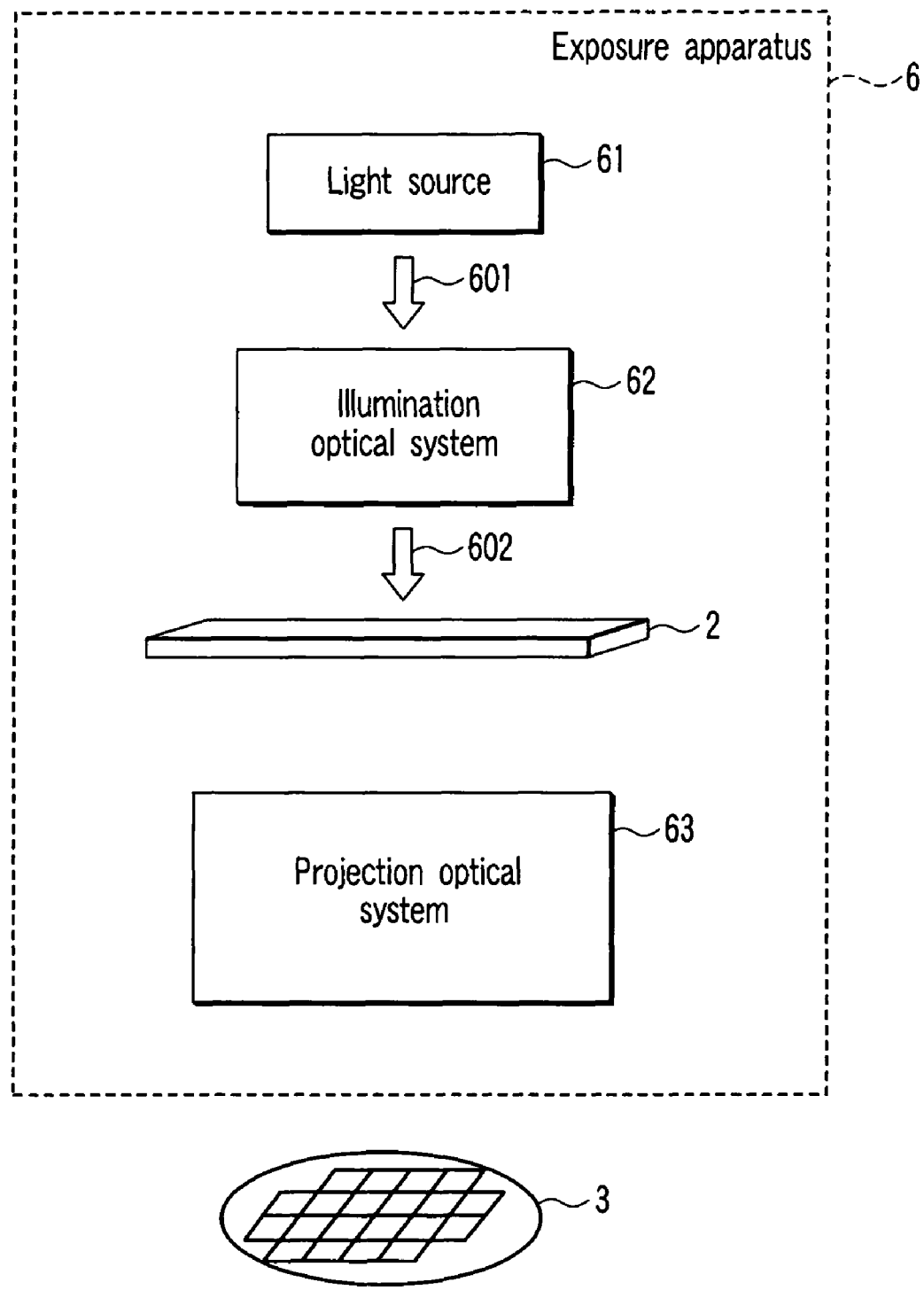
FIG. 6 is a schematic view showing a configuration of an exposure apparatus used in the method for manufacturing a semiconductor device according to the embodiment of the invention.

For example, the photomask 2 is fixed to an exposure apparatus 6 shown in FIG. 6. The exposure apparatus 6 uses an ArF excimer laser beam which is a polarized light as an exposure light source 61. A polarized light 601 emitted from the exposure light source 61 is applied as an illumination light 602 to the photomask 2 via an irradiation optical system 62. An irradiation light 602 passed through the photomask 2 passes through a projection optical system 63 to project a mask pattern formed on the photomask 2 to a wafer 3.

Each of FIGS. 7 and 8 shows a partial structure as an example of a semiconductor device manufactured by using the photomask 2. In the semiconductor device a part of whose wiring pattern is shown in a top view of FIG. 7, management areas 301 to 304 to which the management mask areas 201 to 204 having the management pattern areas 101 to 104 of FIG. 2 formed therein are transferred are arranged on a chip 30. In other words, an element pattern 311 formed by transferring a mask pattern 211 of FIG. 4 is arranged in the management area 301. Additionally, an element pattern 312 formed by transferring a mask pattern 212 is arranged between the management areas 301 and 302.

FIG. 8 is a sectional diagram showing a part of the semiconductor device in the I-I direction of FIG. 7, which includes a semiconductor substrate 300, an insulating layer 305 arranged on the semiconductor substrate 300, and element patterns 311 and 312 arranged on the insulating layer 305.

A case of manufacturing the semiconductor device a part of which is shown in FIGS. 7 to 8 by the semiconductor device manufacturing method a part of which is shown in FIG. 5 will be described below with reference to FIGS. 9 to 12. It is presumed in FIGS. 9 to 12 that the element patterns 311 and 312 are wiring lines and conductive layers are etched to form the element patterns 311 and 312. In other words, an example in which the photomask 2 is a photomask for conductive layer patterning is shown. The method for manufacturing the semiconductor device described below is just an example. Needless to say, various other manufacturing methods can be employed, including modification examples.

(1) In steps S11 to S14, a mask substrate is selected by using the method described above with reference to FIG. 1. That is, the chip area 100 is divided into a plurality of divided areas, and a standard value ST of a mask substrate area in which the management pattern areas 101 to 104 are formed is set. Then, a mask substrate which satisfies the standard value ST is selected among a plurality of mask substrate candidates.

(2) In a step S15, the chip area 100 of FIG. 2 is formed on the selected mask substrate to manufacture the photomask 2 of FIG. 4.

(3) In a step S16, the semiconductor device shown in FIGS. 7 and 9 is manufactured by a series of semiconductor device manufacturing steps including the photolithography process using the photomask 2. That is, an element isolation area (not shown) is formed in a semiconductor substrate 300, and a diffusion area or the like is formed in an active area surrounded with the element isolation area to integrate active elements such as transistors. On the semiconductor substrate 300 including the active elements arranged therein, an insulating layer 305 is formed on a full surface by a technology such as chemical vapor deposition method (CVD method), and planarized by a chemical mechanical polishing (CMP) method or the like. Subsequently, a contact hole (not shown) is bored in a predetermined electrode of the active element by using a photolithography technology or an etching technology. A metal film such as copper is deposited on a full surface of the insulating film 305 by plating deposition or the like, and planarization is executed to fill the contact hole of each electrode (not shown) by the CMP method or the like to form a conductive layer 310, thereby obtaining a structure sectional diagram of FIG. 9.

(4) In a step S161, as shown in FIG. 10, a photoresist film 320 is deposited on a full surface of the conductive layer 310. In a step S162, the photoresist film 320 is subjected to prebaking.

(5) In a step S163, the photomask 2 is fixed to the exposure apparatus 6 shown in FIG. 6, and the photoresist film 320 is exposed by a light passed through the mask pattern formed on the photomask 2. In a step S164, the exposed photoresist film 320 is developed to form openings 330a to 330c, and a part of a surface of the conductive layer 310 is exposed as shown in FIG. 11. In a step S165, photo resist films 321 and 322 are cured by post baking.

(6) In a step S166, with the photoresist films 321 and 322 as masks, the conductive layer 310 is selectively etched to be removed by using a reaction ion etching (RIE) method or the like, and element patterns 311 and 312 are formed as shown in FIG. 12.

(7) In a step S167, the photoresist films 321 and 322 are removed by asking to complete the semiconductor device shown in FIGS. 7 and 8.

A size of birefringence in the management mask areas 201 to 204 of the mask substrate 20 is equal to or less than the standard value ST. Accordingly, in the photolithography process using the photomask 2, a shape fluctuation amount $\Delta CD$ of the photoresist film 321 of FIG. 11 to which the mask pattern 211 arranged in the management mask area 201 is transferred is equal to or less than the permissible limit LT.

Thus, the element patterns 311 can be formed with high accuracy. On the other hand, the photoresist film 322 to which the mask pattern 212 arranged outside the management mask areas 201 to 204 is transferred has polarization degree error sensitivity smaller as compared with the photoresist film 321. In other words, as the shape fluctuation amount $\Delta CD$ of the photoresist film 321 is small, a shape changing amount of the element pattern 312 from a desired shaped is within a permissible range.

According to the method of selecting the mask substrate of the embodiment of the present invention, inspection is carried out to determine whether the mask birefringence satisfies the standard value in the mask substrate area in which the management pattern areas 101 to 104 are formed. In the areas other than the management pattern areas 101 to 104, the shape fluctuation amount $\Delta CD$ is small even when the size of birefringence of an illumination light fluctuates. Thus, setting of a standard value of birefringence is unnecessary in the mask substrate area in which the divided areas other than the management pattern areas 101 to 104 are formed. In other words, the mask substrate includes divided areas in which no standard value of a size of birefringence is set. As compared with the case of selecting the mask substrate based on the birefringence size of the entire mask substrate, it is possible to prevent a reduction in yield of the mask substrate by selecting the mask substrate only based on the birefringence size of the mask substrate area in which the management pattern areas 101 to 104 are formed. In other words, according to the selecting method of the mask substrate of the embodiment of the present invention, it is possible to suppress an increase in photomask manufacturing costs. As a result, by applying the photomask manufactured by using the mask substrate selected by the mask substrate selecting method of the embodiment of the invention, it is possible to suppress an increase in semiconductor device manufacturing costs.

First Modification Example

A method for selecting a mask substrate according to a first modification example of the embodiment of the present invention is characterized in that inspection of a size MR of birefringence of a mask substrate area includes first inspection, and second inspection which is executed after a mask substrate subjected to the first inspection has been rotated around a normal direction as a rotary axis passing through a center of a substrate surface having a chip area formed therein, thereby changing a sequence of a plurality of management patterns. In other words, when a size MR of birefringence of a mask substrate area in which management pattern areas 101 to 104 are formed does not satisfy a standard value ST in the first inspection, the second inspection is carried out in a state in which a mask substrate candidate is rotated by 90, 180 or 270 degrees.

As the mask substrate is generally square, even in the state in which the mask substrate is rotated by 90, 180 or 270 degrees, a photomask can be manufactured by forming an element pattern on the mask substrate. Accordingly, by rotating the mask substrate, when a mask substrate area in which a size of birefringence does not satisfy the standard value can be removed from mask substrate areas having management pattern areas formed therein, it is possible to manufacture a photomask by forming an element pattern on the rotated mask substrate.

Thus, in the state in which the mask substrate is rotated by 90, 180 or 270 degrees, when the size MR of birefringence of the mask substrate area having the management pattern areas formed therein satisfies the standard value ST, it is possible to manufacture the photomask by forming the element pattern on the mask substrate in the rotated state of the mask substrate.

Each of FIGS. 13A to 13D shows an example of a mask substrate 40 configured with management mask areas 401 to 404 in which management pattern areas 101 to 104 are arranged, and a defective substrate area 405 in which a size MR of birefringence does not satisfy the standard value ST.

Figure 13A:
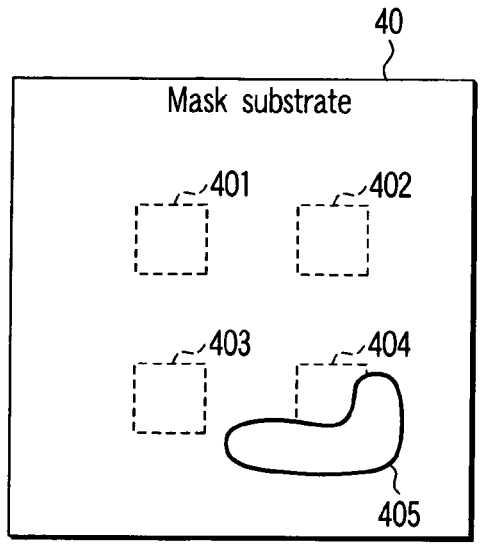
FIG. 13A is a top view of a mask substrate for explaining a method for selecting a mask substrate according to a first modification example of the embodiment of the invention, the mask substrate being subjected to a first inspection.
Figure 13B:
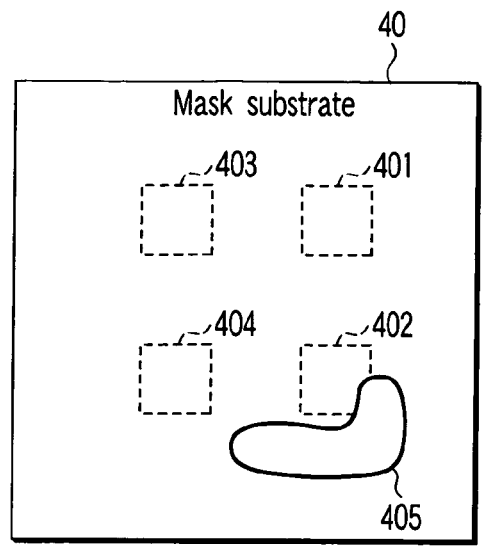
FIG. 13B is a top view of a mask substrate shown by rotating the top view of the mask substrate of FIG. 13A by 90 degrees.
Figure 13C:
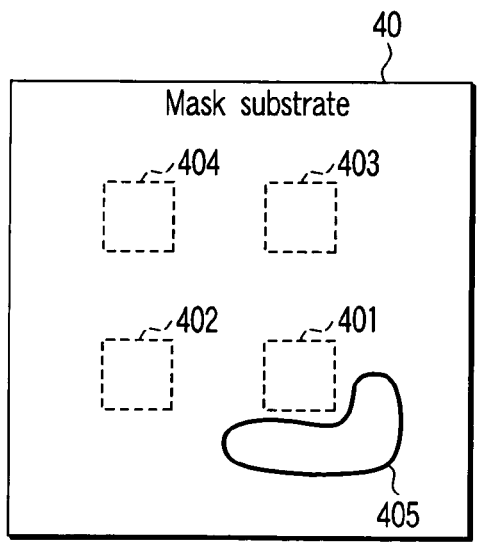
FIG. 13C is a top view of a mask substrate shown by rotating the top view of the mask substrate of FIG. 13A by 180 degrees.
Figure 13D:
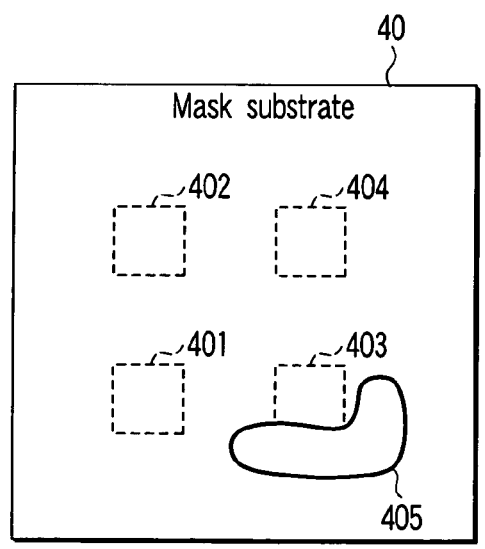
FIG. 13D is a top view of a mask substrate shown by rotating the top view of the mask substrate of FIG. 13A by 270 degrees.

FIG. 13A shows a state of the mask substrate 40 in first inspection. That is, the management pattern areas 101 to 104 are arranged in the management mask areas 401 to 404. FIG. 13B shows a state of the mask substrate 40 rotated counterclockwise by 90 degrees with respect to FIG. 13A. The management pattern areas 101 to 104 are arranged in the management mask areas 403, 401, 404 and 402. FIG. 13C shows a state of the mask substrate 40 rotated counterclockwise by 180 degrees with respect to FIG. 13A. The management pattern areas 101 to 104 are arranged in the management mask areas 404, 403, 402 and 401. FIG. 13D shows a state of the mask substrate 40 rotated counterclockwise by 270 degrees with respect to FIG. 13A. The management pattern areas 101 to 104 are arranged in the management mask areas 402, 404, 401 and 403.

In FIGS. 13A, 13B and 13D, as the management mask areas 404, 402 and 403 overlap the defective substrate area 405, the mask substrate 40 does not satisfy the standard value ST. However, as shown in FIG. 13C, in the counterclockwise 180-degree rotated state from a state of measuring substrate birefringence first, there is no overlapping between the defective substrate area 405 and the management mask areas 401 to 404. In other words, it is possible to manufacture a photomask by forming an element pattern on the mask substrate 40 in the state of FIG. 13C.

According to the mask substrate selecting method of the first modification example of the embodiment of the present invention, the photomask can be manufactured in accordance with a size distribution of birefringence on the mask substrate. As a result, it is possible to increase mask substrate yield and to suppress an increase in photomask manufacturing costs.

Second Modification Example

Figure 14:
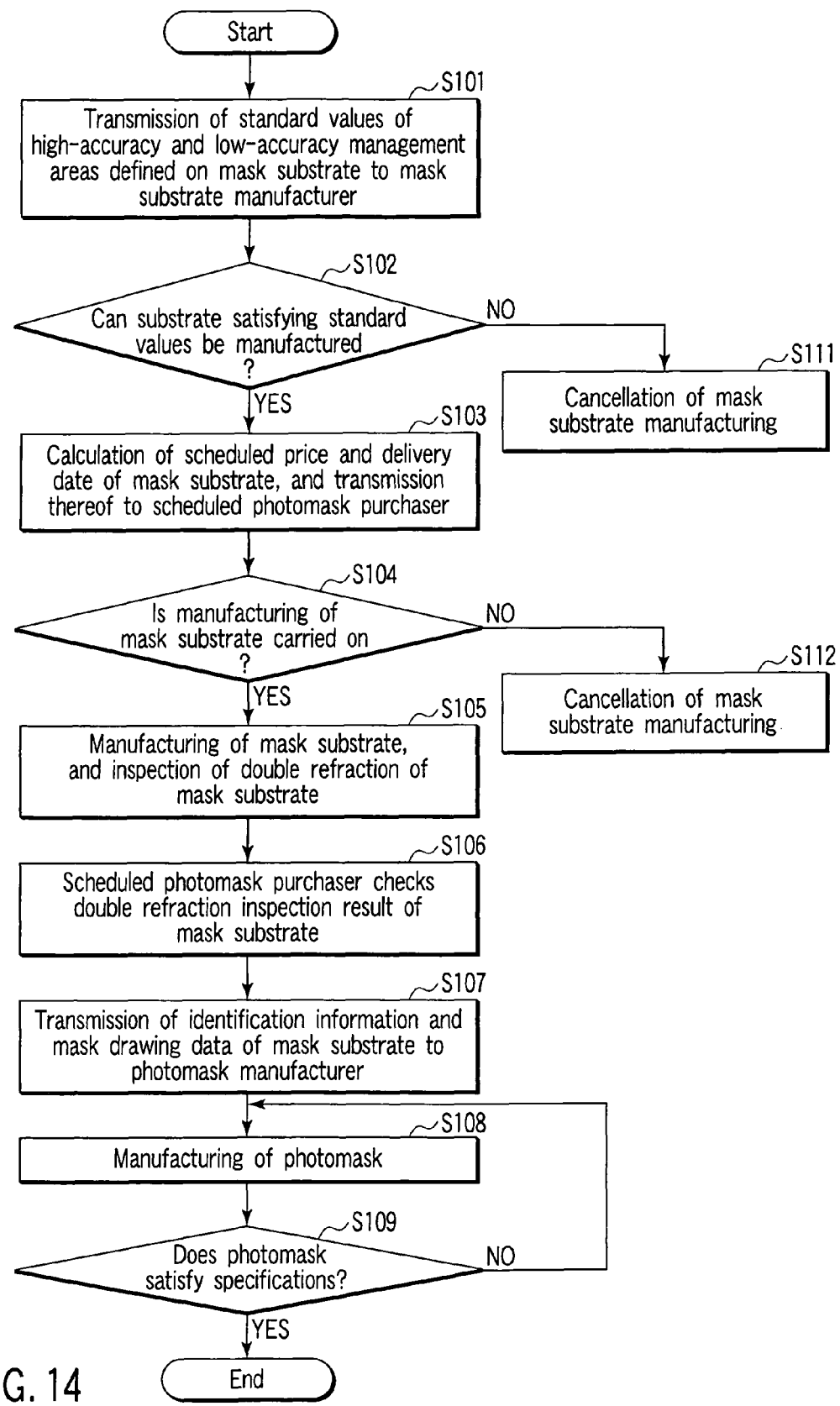
FIG. 14 is a flowchart for explaining an example of a method for manufacturing a photomask according to a second modification example of the embodiment of the invention.

FIG. 14 shows a photomask manufacturing method according to a second modification example of the embodiment of the present invention. A flowchart of FIG. 14 shows an example of a photomask manufacturing method when a mask substrate manufacturer for manufacturing a mask substrate and a photomask manufacturer for manufacturing a photomask are different from each other, and the mask substrate manufacturer selects a mask substrate. The photomask manufacturing method of FIG. 14 will be described.

(1) In a step S101, a scheduled photomask purchaser such as a semiconductor device manufacturer defines a mask substrate area in which an element pattern needing highly accurate size management is formed (hereinafter referred to as "high-accuracy management pattern area") and a mask substrate area in which an element pattern needing no highly accurate size management (hereinafter referred to as "low-accuracy management pattern area") on a mask substrate. Taking the example of the chip area 100 shown in FIG. 2, the mask substrate area in which the management pattern areas 101 to 104 are formed is a high-accuracy management pattern area or a low-accuracy management pattern area area. The scheduled photomask purchaser sets standard values ST1 and ST2 in the high-accuracy and low-accuracy management pattern areas. Information of the high-accuracy and low-accuracy management pattern areas and the standard values ST1 and ST2 is transmitted to the substrate manufacturer.

(2) In a step S102, the mask substrate manufacturer determines whether it is possible to manufacture a mask substrate which satisfies the standard values ST1 and ST2 in the high-accuracy and low-accuracy management pattern areas transmitted from the scheduled photomask purchaser. If it is impossible to manufacture a mask substrate which satisfies the standard values, this is announced to the scheduled photomask purchaser to cancel the mask substrate manufacturing (a step S111). On the other hand, if it is possible to manufacture a mask substrate which satisfies the standard values, in a step S103, the mask substrate manufacturer calculates a scheduled price and a scheduled delivery date of the mask substrate based on past manufacturing information, price information or the like. The calculated scheduled price and delivery date of the mask substrate are transmitted to the scheduled photomask purchaser.

(3) In a step S104, the scheduled photomask purchaser determines whether to advance the mask substrate and photomask manufacturing based on the transmitted scheduled price and delivery date of the mask substrate, and a determination result is transmitted to the mask substrate manufacturer. If the manufacturing of the mask substrate is not advanced, this is transmitted to the mask substrate manufacturer to cancel the mask substrate manufacturing (a step S112). If the mask substrate and photomask manufacturing is advanced, the process proceeds to a step S105.

(4) In the step S105, the mask substrate manufacturer receives the announcement of the mask substrate manufacturing from the scheduled photomask purchaser to manufacture a mask substrate. The mask substrate manufacturer inspects birefringence of the manufactured mask substrate by using the above method. An inspection result is transmitted to the scheduled photomask purchaser.

(5) In a step S106, the scheduled photomask purchaser checks birefringence inspection result of the mask substrate. In a step S107, identification information of the manufactured mask substrate and mask drawing data are transmitted from the scheduled photomask purchaser to the photomask manufacturer. Upon reception of the data from the scheduled photomask purchaser, the photomask manufacturer receives the mask substrate from the mask substrate manufacturer.

(6) In a step S108, the photomask manufacturer forms a pattern on the mask substrate by using the mask drawing data received from the scheduled photomask purchaser to manufacture a photomask.

(7) In a step S109, the photomask manufacturer inspects a size, a defect or the like of the manufactured photomask, and ships a photomask which satisfies prescribed photomask specifications to the scheduled photomask purchaser. When the photomask does not satisfy the prescribed specifications, the process returns to the step S108 to manufacture a photomask again.

According to the photomask manufacturing method described above, when the mask substrate manufacturer, the photomask manufacturer, and the scheduled photomask purchaser are different from one another, it is possible to manufacture a photomask by using the mask substrate which satisfies the birefringence standard value.

Third Modification Example

Figure 15:
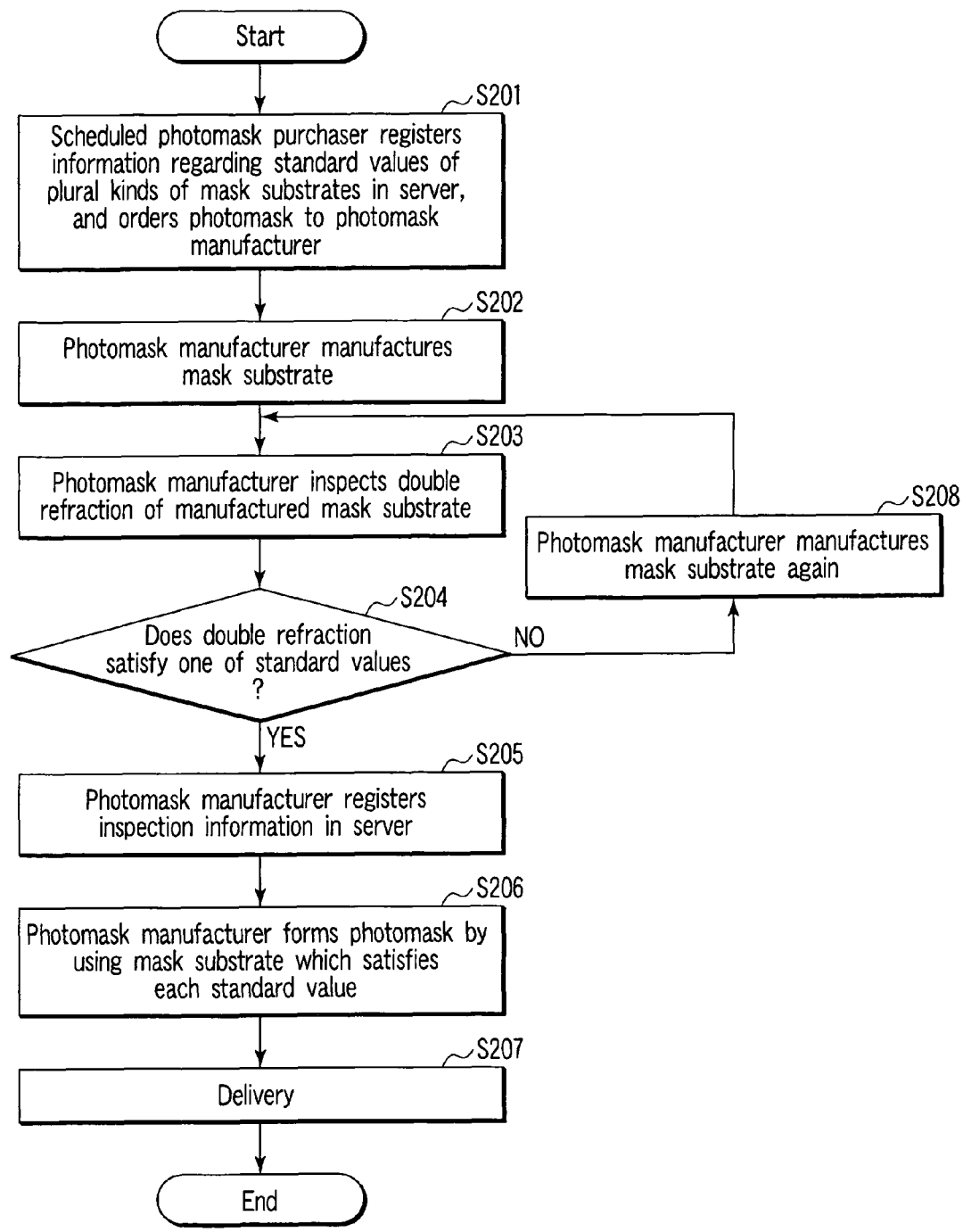
FIG. 15 is a flowchart for explaining another example of a method for manufacturing a photomask according to a third modification example of the embodiment of the invention.

FIG. 15 shows a photomask manufacturing method according to a third modification example of the embodiment of the present invention. A flowchart of FIG. 15 shows an example of a photomask manufacturing method when a scheduled photomask purchaser manufactures plural kinds of photomasks. The photomask manufacturing method of FIG. 15 can be applied to a case in which a mask substrate manufacturer and a photomask manufacturer are the same, and a case in which a photomask manufacturer inspects a mask substrate.

The photomask manufacturing method shown in FIG. 15 can use a network system of FIG. 16 which includes a network 50 having a scheduled photomask purchaser 51 and a photomask manufacturer 52 connected thereto, and a server 53 connected to the network 50. A birefringence standard value, a birefringence inspection result of a mask substrate, or the like is registered in the server 53. A connection type to the network 50 shown in FIG. 16 may be wired or wireless. An example of executing the photomask manufacturing method shown in FIG. 15 by using the network system of FIG. 16 will be described below.

(1) In a step S201 of FIG. 15, the scheduled photomask purchaser 51 defines high-accuracy and low-accuracy management pattern areas as in the case of the method described above with reference to the flowchart of FIG. 14. Additionally, the scheduled photomask purchaser 51 sets birefringence standard values of the high-accuracy and low-accuracy management pattern areas. As there are a plurality of photomasks to be manufactured, for a mask substrate used for each photomask, birefringence standard values of the high-accuracy and low-accuracy management pattern areas are set. The scheduled photomask purchaser 51 registers information regarding the set standard values in the server 53 via the network 50 shown in FIG. 16 to order photomasks to the photomask manufacturer 52.

(2) In a step S202, the photomask manufacturer 52 manufactures a mask substrate in accordance with the order from the scheduled photomask purchaser 51. Alternatively, the photomask manufacturer 52 may order a mask substrate to the mask substrate manufacturer.

(3) In a step S203, the photomask manufacturer 52 obtains the information regarding the standard values registered in the server 53 via the network 50. Then, the photomask manufacturer 52 inspects birefringence of the manufactured mask substrate by the above method.

(4) In a step S204, based on an inspection result of the mask substrate in the step S203, the photomask manufacturer 52 determines whether the manufactured mask substrate satisfies one of the standard values of the mask substrates used for a plurality of photomasks to be manufactured. If the manufactured mask substrate satisfies one of the standard values of the mask substrates used for the plurality of mask substrates to be manufactured, in a step S205, the photomask manufacturer 52 registers the birefringence inspection result of the mask substrate which satisfies the standard value in the server 53. Then, the process proceeds to a step S206. On the other hand, if the manufactured mask substrate satisfies none of the standard values, a mask substrate is manufactured again (a step S208). The mask substrate that does not satisfy the standard value is used for manufacturing another photomask of a less strict standard value, or discarded.

(5) In the step S206, the photomask manufacturer 52 manufactures each photomask by using a mask substrate which satisfies a standard value of a mask substrate used for each photomask, i.e., usable for each photomask.

(6) In a step S207, the photomask manufacturer 52 delivers the manufactured photomask to the scheduled photomask purchaser 51. The scheduled photomask purchaser 51 can obtain a result of birefringence inspection by accessing the server 53 when necessary.

According to the photomask manufacturing method described above, it is possible to smoothly manufacture the photomask by transmitting the plurality of birefringence standard values from the scheduled photomask purchaser 51 to the photomask manufacturer 52 via the network 50. Moreover, even when the manufactured mask substrate does not satisfy any of the standard values, a reduction in mask substrate yield is suppressed as other standard values may be satisfied. As a result, it is possible to suppress an increase in photomask manufacturing costs.

A photomask price is generally referred to as a rate of the number of mask substrates which satisfy standard values with respect to all the number of manufactured mask substrates (hereinafter referred to as "mask substrate yield"). The mask substrate yield depends on setting of standard values. Thus, for example, the following procedure may be added to execute proper transaction in the photomask manufacturing method by using the flowchart of FIG. 15. In other words, the photomask manufacturer 52 sets a photomask price by taking the mask substrate yield into consideration before the photomask is manufactured. Then, acceptance of the scheduled photomask purchaser regarding the set photomask price is obtained. An example in which the photomask manufacturer 52 manufactures a photomask after acquisition of acceptance of the scheduled photomask purchaser 51 regarding the photomask price will be described below with reference to a flowchart of FIG. 17.

Figure 17:
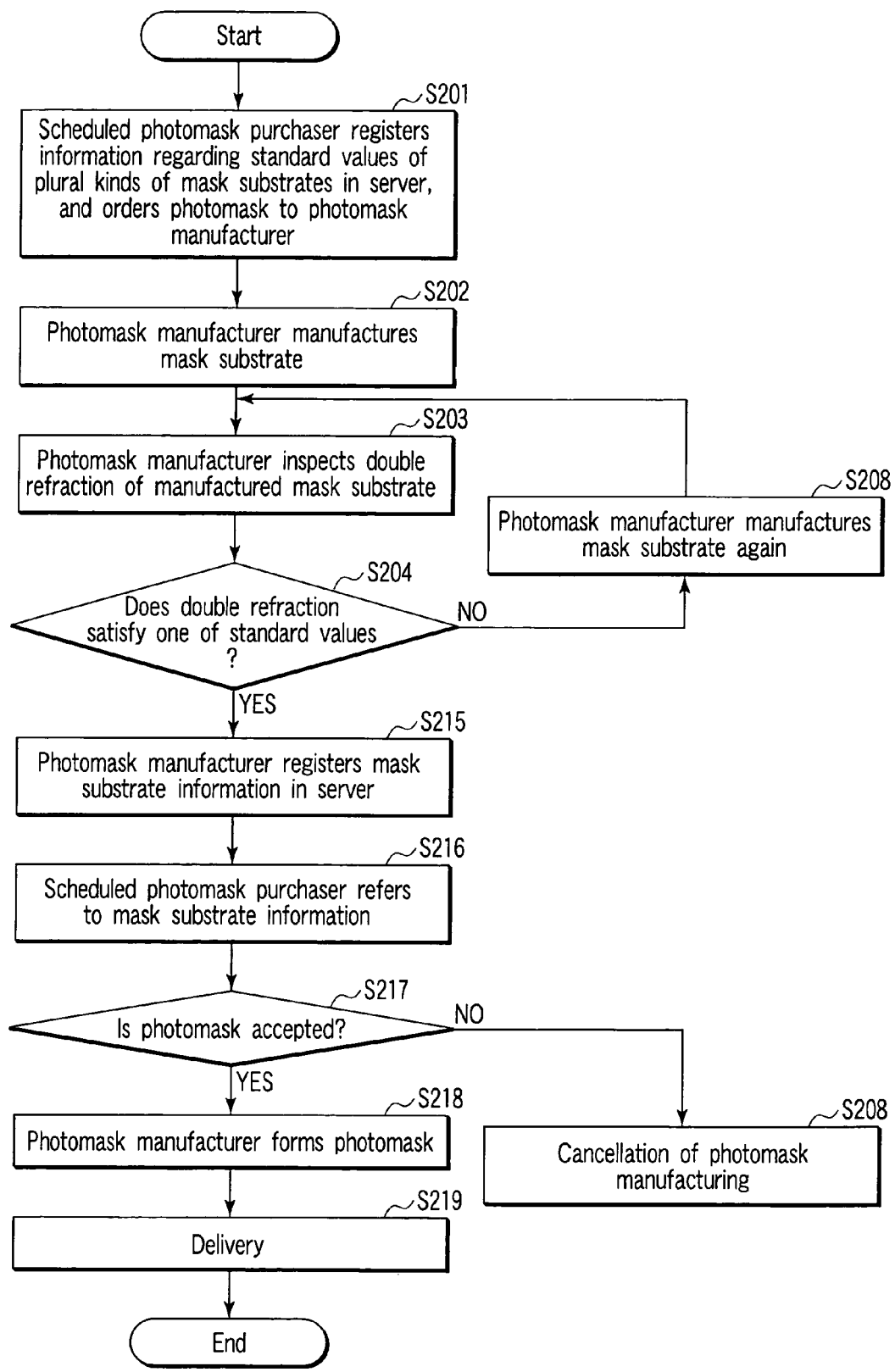
FIG. 17 is a flowchart for explaining another example of the method for manufacturing a photomask according to the third modification example of the embodiment of the invention.

(1) In steps S201 to S204 of FIG. 17, as in the case of the method described above with reference to the flowchart of FIG. 15, the photomask manufacturer 52 manufactures a mask substrate according to an order from the scheduled photomask purchaser 51, and determines whether the manufactured mask substrate satisfies standard values.

(2) In a step S215, if the manufactured mask substrate satisfies one of a plurality of standard values, the photomask manufacturer 52 registers mask substrate information regarding a birefringence inspection result, a scheduled photomask delivery data, a photomask sales price or the like in the server 53. In other words, the mask substrate information is provided to the scheduled photomask purchaser 51 via the network 50.

(3) In a step S216, the scheduled photomask purchaser 51 refers to the mask substrate information registered in the server 53. Then, in a step S217, the scheduled photomask purchaser 51 determines whether to accept a photomask manufactured by using the mask substrate whose information has been registered. A determination result is transmitted to the photomask manufacturer 52. If the scheduled photomask purchaser 51 determines acceptance of the photomask, the process proceeds to a step S218. On the other hand, if the scheduled photomask purchaser 51 determines nonacceptance of the photomask, the photomask manufacturing is cancelled (a step S220). However, the scheduled photomask purchaser 51 may review the standard values to revise mask pattern designing or the like so that the photomask can be manufactured by using the mask substrate whose information has been registered.

(4) In the step S218, the photomask manufacturer 52 notified of photomask acceptance from the scheduled photomask purchaser 51 manufactures a photomask by using the mask substrate whose information has been registered in the server 53. In a step S219, the photomask manufacturer 52 delivers the manufactured photomask to the scheduled photomask purchaser 51.

According to the photomask manufacturing method described above, the photomask manufacturer 52 sets the photomask price by taking the mask substrate yield into consideration before the photomask manufacturing. Then, after acquisition of acceptance of the scheduled photomask purchaser 51 regarding the photomask price, the photomask is manufactured thereby enabling proper transactions.

Other Embodiments

The embodiment of the present invention has been described. However, it should be understood that the discussion and the drawings constituting parts of the disclosure are in no way limitative of the invention. As apparent to those skilled in the art, various changes, alternative embodiments and operation technologies can be made.

For example, in the case of defining management pattern areas, a management pattern area setting device which automatically extracts a management pattern area based on conditions on wiring half pitches and layout data of a semiconductor device may be used.

Needless to say, the invention includes various embodiments which are not described herein. Therefore, a technical scope of the invention is defined only by specific matters of the invention related to claims appropriate from the above description.

According to the embodiment, it is possible to provide a photomask substrate selecting method, a photomask manufacturing method, and a semiconductor manufacturing method, capable of suppressing an increase in manufacturing costs of a photomask having birefringence.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for selecting a photomask substrate, comprising:
dividing a chip area scheduled to be arranged on the photomask substrate regarding a specific transfer pattern layer into a management pattern area in which an element pattern changed in shape by birefringence of the photomask substrate is arranged, and an area other than the management pattern area;
setting a standard value of a size of birefringence of an area in which the management pattern area of the photomask substrate is arranged;
inspecting the size of the birefringence of the area in which the management pattern area is arranged, the area being arranged in each of a plurality of photomask substrate candidates which have no chip patterns; and
selecting a photomask substrate, in which the size of the birefringence satisfies the standard value, as a photomask substrate of the specific transfer pattern layer from the plurality of photomask substrate candidates.

2. The method according to claim 1, wherein the plurality of management pattern areas are set, and accuracy of the inspection is set for each of the plurality of management pattern areas based on shapes of element patterns included in the plurality of management pattern areas.

3. The method according to claim 1, wherein the number of inspecting places of a size of birefringence of the photomask substrate area in which the management pattern areas are formed is set larger than that of inspecting places of the mask substrate area in which divided areas other than the management pattern areas are formed.

4. The method according to claim 1, wherein the size of the birefringence is inspected by investigating a polarized state of an irradiation light passed through the photomask substrate.

5. The method according to claim 1, wherein, in the selection, determination is made to as whether a maximum value of a size of birefringence in one and the same management pattern area, or an average value of sizes of birefringence in one and the same management pattern area is equal to or less than the standard value.

6. The method according to claim 1, wherein the management pattern area is a chip area including a plurality of adjacent wiring groups and a wiring pattern whose half pitch is equal to or less than 1/3 of a wavelength of an illumination light of an exposure apparatus.

7. The method according to claim 1, wherein an element pattern included in the management pattern area is a part of a wiring group narrower in wiring width and pitch than that including the element pattern included in an area other than the management pattern area.

8. The method according to claim 2, wherein the inspection includes first inspection, and second inspection which is executed after the photomask substrate candidate subjected to the first inspection has been rotated around a normal direction as a rotary axis passing through a center of a substrate surface having a chip area arranged therein, thereby changing a sequence of the plurality of management patterns.

9. The method according to claim 8, wherein the photomask substrate candidate is rotated by 90, 180 or 270 degrees.

10. A method for manufacturing a photomask, comprising:
dividing a chip area scheduled to be arranged on a photomask substrate regarding a specific transfer pattern layer into a management pattern area in which an element pattern changed in shape by birefringence of the photomask substrate is arranged, and an area other than the management pattern area;
setting a standard value of a size of birefringence of an area in which the management pattern area of the photomask substrate is arranged;
inspecting the size of the birefringence of the area in which the management pattern area is arranged, the area being arranged in each of a plurality of photomask substrate candidates which have no chip patterns;
selecting a photomask substrate, in which the size of the birefringence satisfies the standard value, as a photomask substrate of the specific transfer pattern layer from the plurality of photomask substrate candidates; and
forming the plurality of element patterns included in the chip area on the selected photomask substrate to manufacture the photomask of the specific transfer pattern layer.

11. The method according to claim 10, wherein the plurality of management pattern areas are set, and accuracy of the inspection is set for each of the plurality of management pattern areas based on shapes of element patterns included in the plurality of management pattern areas.

12. The method according to claim 11, wherein the inspection includes first inspection, and second inspection which is executed after the photomask substrate candidate subjected to the first inspection has been rotated around a normal direction as a rotary axis passing through a center of a substrate surface having a chip area arranged therein, thereby changing a sequence of the plurality of management patterns.

13. The method according to claim 10, wherein the set standard value is registered.

14. The method according to claim 10, wherein a result of the inspection is registered.

15. A method for manufacturing a semiconductor device, comprising:

dividing a chip area scheduled to be arranged on a photomask substrate regarding a specific transfer pattern layer into a management pattern area in which an element pattern changed in shape by birefringence of the photomask substrate is arranged, and an area other than the pattern area;

setting a standard value of a size of birefringence of an area in which the management pattern area of the photomask substrate is arranged;

inspecting the size of the birefringence of the area in which the management pattern area is arranged, the area being arranged in each of a plurality of photomask substrate candidates which have no chip patterns;

selecting a photomask substrate, in which the size of the birefringence satisfies the standard value, as a photomask substrate of the specific transfer pattern layer from the plurality of photomask substrate candidates;

repeating the selection of the photomask substrate of the specific transfer pattern layer for the plurality of transfer pattern layers to form the plurality of element patterns included in the chip area for each corresponding transfer pattern layer on the plurality of photomask substrates selected for each transfer pattern, thereby manufacturing a plurality of photomasks; and combining a photolithography process using the plurality of photomasks with another process to process at least one of a surface of the semiconductor substrate and a thin film formed on the surface of the semiconductor substrate.

* * * * *

UNITED STATES PATENT AND TRADEMARK OFFICE
CERTIFICATE OF CORRECTION

PATENT NO. : 7,740,994 B2
APPLICATION NO. : 11/585130
DATED : June 22, 2010
INVENTOR(S) : Fukuhara et al.

Page 1 of 1

It is certified that error appears in the above-identified patent and that said Letters Patent is hereby corrected as shown below:

Title page, Item (75), in the Inventors, line 2:

"Masamitsu Itoh, Tokyo (JP)" should read

--Masamitsu Itoh, Yokohama (JP)--.

Signed and Sealed this

Thirty-first Day of August, 2010

David J. Kappos
*Director of the United States Patent and Trademark Office*